(12) United States Patent
Senzaki

(10) Patent No.: US 7,335,569 B2
(45) Date of Patent: Feb. 26, 2008

(54) IN-SITU FORMATION OF METAL INSULATOR METAL CAPACITORS

(75) Inventor: Yoshihide Senzaki, Austin, TX (US)

(73) Assignee: Aviza Technology, Inc., Scotts Valley, CA (US)

( * ) Notice: Subject to any disclaimer, the term of this patent is extended or adjusted under 35 U.S.C. 154(b) by 196 days.

(21) Appl. No.: 10/521,636

(22) PCT Filed: Jul. 18, 2003

(86) PCT No.: PCT/US03/22385

§ 371 (c)(1),
(2), (4) Date: Jan. 19, 2006

(87) PCT Pub. No.: WO2004/010471

PCT Pub. Date: Jan. 29, 2004

(65) Prior Publication Data

US 2006/0151852 A1 Jul. 13, 2006

Related U.S. Application Data

(60) Provisional application No. 60/396,734, filed on Jul. 19, 2002.

(51) Int. Cl.
*H01L 21/20* (2006.01)
*H01L 29/00* (2006.01)
(52) U.S. Cl. ............... 438/393; 438/250; 257/532
(58) Field of Classification Search ............ 438/238, 438/680, 250–252, 393–395; 257/296, 306, 257/310, 532
See application file for complete search history.

(56) References Cited

U.S. PATENT DOCUMENTS

| | | | |
|---|---|---|---|
| 6,551,399 B1* | 4/2003 | Sneh et al. | 117/102 |
| 6,573,150 B1 | 6/2003 | Urdahl et al. | |
| 2001/0034097 A1* | 10/2001 | Lim et al. | 438/253 |
| 2002/0074584 A1 | 6/2002 | Yang | |
| 2003/0168750 A1* | 9/2003 | Basceri et al. | 257/915 |

\* cited by examiner

*Primary Examiner*—Tuan H. Nguyen
(74) *Attorney, Agent, or Firm*—Morgan, Lewis & Bockius LLP

(57) ABSTRACT

The invention describes an in-situ method of fabricating a metal insulator metal (MIM) capacitor and products formed by the same. The method utilizes atomic layer deposition (ALD) or metal-organic chemical vapor deposition (MOCVD). In the method, a metal precursor is sequentially reacted with a nitrogen source, oxidant, and then a nitrogen source again. Reaction with the nitrogen source generates the outermost conductive metal nitride (MN) layers (121). Reaction with the oxidant generates an inner dielectric metal oxide ($MO_x$) layer (110). Alternatively, or in addition, the metal precursor can be reacted with a mixture of oxidant and nitrogen source to generate inner dielectric layer(s) (231, 232, 310) of metal oxynitride ($MO_xN_y$). Because the same metal is used throughout the capacitor, the layers in the MIM capacitor exhibits excellent compatibility and stability.

16 Claims, 4 Drawing Sheets

IN-SITU FORMATION OF METAL INSULATOR METAL CAPACITORS

CROSS REFERENCE TO RELATED APPLICATIONS

The present application claims the benefit of and priority from commonly assigned U.S. Provisional Patent Application Ser. No. 60/396,734, entitled IN-SITU FORMATION OF METAL INSULATOR METAL CAPACITORS, and filed Jul. 19, 2002, which is incorporated herein by reference in its entirety.

TECHNICAL FIELD

The present invention relates generally to the field of metal insulator metal ("MIM") capacitors and methods of forming the same. More specifically, the present invention relates to in-situ methods of forming MIM capacitors from a single metal amide precursor and MIM capacitors produced thereby.

BACKGROUND

As the scale of electronic components decrease, the pressure increases to find alternative materials and methods for the formation or deposition of multi-component films, layers and coatings on substrates or wafers having desirable electrical and physical properties. In particular, semiconductor devices of future generations require thinner dielectric films having a high dielectric constant for capacitors having increased capacitance.

Among the most promising candidates for dielectric materials are metal oxides, such as a tantalum oxide ($Ta_2O_5$), which are known for use in generating insulating films that exhibit improved insulating properties. Such films have been formed by chemical vapor deposition ("CVD") or metal organic chemical vapor deposition ("MOCVD") using two or more different metal precursors.

The use of metal amide-based precursors for the CVD of oxide and nitride has been reported. For example, tantalum oxide ($Ta_2O_5$) and tantalum nitride (TaN) have been deposited from a tantalum amide/imide type precursor R—N=Ta($NR_2$)$_3$, wherein R is an alkyl group. Finally, it has been reported in the literature that tantalum oxynitride ($TaO_xN_y$) is a better dielectric than commonly used tantalum oxide ($Ta_2O_5$) for capacitor applications.

However, prior art deposition chemical vapor deposition techniques using two or more different metal precursors are increasingly unable to meet the requirements of advanced thin films. The use of two or more different metal precursors to form the layers in the MIM capacitor can result in incompatibility and instability between the layers detrimentally effecting the electrical properties of the ultimate capacitor. In addition, the use of two or more different metal precursors increases production time and necessitates a more complex CVD reactor configuration, and therefore increases expense.

Accordingly, there is a need for a method for forming MIM capacitors increases compatibility and stability between the layers, reduces production time and simplifies the reactor configuration, thereby reducing fabrication costs. It is desirable that the MIM capacitors produced by the method exhibit improved electrical properties, and uniformity between MIM capacitors formed across a single substrate or multiple substrates and in sequentially performed processes. It is further desirable that the MIM capacitors produced by the method exhibit no undesired reaction between adjacent layers or phase separation between the layers of the capacitor structure.

SUMMARY

The method of the present application provides a solution to these and other problems, and offers other advantages over the prior art.

An atomic layer deposition ("ALD") or metal organic chemical vapor deposition ("MOCVD") process is used to fabricate metal insulator metal ("MIM") capacitors from a single metal amide precursor rather than from two or more different precursors. The use of a single precursor to form each layer of the capacitor insures conformal film deposition on non-planar device geometry and reduces production time and expense.

The MIM capacitor is fabricated through sequential reaction of a metal amide precursor with ammonia ($NH_3$), then an oxidant, and then ammonia again. The product is a stacked MIM structure wherein each layer of metal oxide is sandwiched between two layers of metal nitride. In this embodiment, the product is a $MN/MO_z/MN$ conformation wherein M is the same metal throughout structure. Since the metal nitride layers are conductive electrodes and the metal oxide layer is highly dielectric (dielectric constant k above 10), an MIM capacitor is formed.

Optionally, the interface between the metal nitride and metal oxide layers is a layer of metal oxynitride ($MO_xN_y$) which serves to increase compatibility between the metal nitride and metal oxide layers, as well as to improve the stability and electrical properties of the ultimate capacitor. In this embodiment, the product is a $MN/MO_xN_y/MO_z/MO_xN_y/MN$ conformation wherein M is the same metal throughout the structure. The metal oxynitride layers may be generated by exposing the same metal amide precursor to a mixture of ammonia and oxidant.

Optionally, the metal oxynitride layers may be utilized in lieu of the metal oxide layers since metal oxynitride has better dielectric properties. In this embodiment, the product is a $MN/MO_xN_y/MN$ conformation wherein M is the same metal throughout the structure.

BRIEF DESCRIPTION OF THE DRAWINGS

These and various other features and advantages of the present cooling system will be apparent upon reading of the following detailed description in conjunction with the accompanying drawings and the appended claims provided below, where:

DETAILED DESCRIPTION

Figure 1:
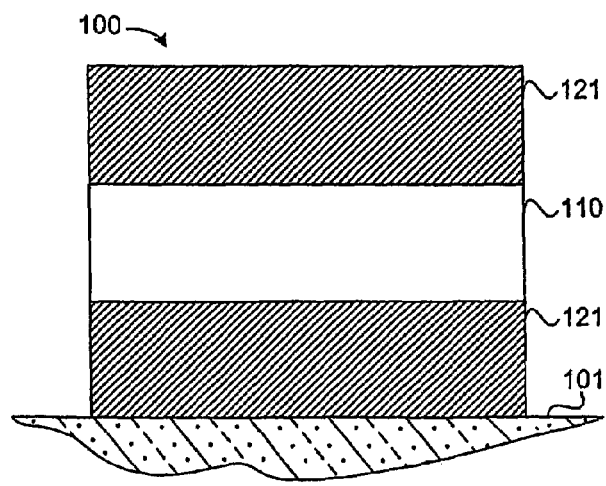
FIG. 1 is a schematic sectional side view of a first MIM capacitor made in accordance with an embodiment of the present invention.

In the present invention, a process is used to fabricate metal insulator metal ("MIM") capacitors in-situ from a single metal amide precursor. The use of a single precursor to form the layers in the capacitor insures compatibility and stability between the layers, reduces production time and simplifies the reactor configuration, and therefore, reduces expense.

As stated, the present invention may be utilized in an atomic layer deposition ("ALD") or metal organic chemical vapor deposition ("MOCVD") process.

As appreciated by those knowledgeable in the art, MOCVD is a process wherein a metal-organic compound and one or more other reactants are introduced, in a gaseous or liquid form, into a reaction chamber to form a desired film on the surface of a base material, such as semiconductor and other types substrates or wafer. The compounds react within the reaction chamber to form the desired film, e.g., a metal oxide or metal nitride or metal oxynitride. The film forms a layer on the base material which generally includes a material whose surface is able to bind the precipitate, e.g. silicon.

The present invention may also be utilized in an ALD process. In ALD, a metal-organic compound is introduced, in a gaseous or liquid state, into a reaction chamber. The reaction chamber contains a base material whose surface is able to chemically or mechanically bind the metal-organic compound, e.g., silicon. This generates an atomic layer, or mono-layer, of metal-organic compound on the surface of the base material. Excess metal-organic compound is then purged from the chamber. Next, one or more reactants are introduced into the chamber in a gaseous or liquid state. The reactants react with the metal-organic mono-layer and convert it into more desirable material, e.g., a metal oxide or metal nitride or metal oxynitride. The process is then repeated until the desired layer thickness is achieved.

ALD has several advantages relative to MOCVD, namely, operability at comparatively low temperatures, high precursor utilization efficiency, and the ability to produce conformal thin film layers. In addition, it is possible using ALD to control film thickness on an atomic scale and, thereby, "nano-engineer" complex thin films.

In the present invention, MIM capacitors are fabricated in-situ using the MOCVD or ALD process by sequential reaction of the metal amide precursor with a nitrogen source, oxidant, and then another round of a nitrogen source. Each reaction step may be repeated several times before preceding to the next reaction step.

The nitrogen source is preferably ammonia and the invention will be described using ammonia. However, it should be recognized that other nitrogen sources may be utilized with roughly equivalent effect, such as hydrazine ($H_2NNH_2$), primary, secondary and tertiary alkyl amines, alky hydrazine, and atomic nitrogen (N).

The oxidant is not limited. However, examples of preferred oxidants include oxygen ($O_2$), ozone ($O_3$), nitrous oxide ($N_2O$), nitric oxide (NO), hydrogen peroxide ($H_2O_2$) and atomic oxygen (O).

A number of metal amide precursors may be used in the invention. Metal amides are nitrogenous compounds related to or derived from ammonia and are generally characterized by the presence of a metal group bonded through a single bond to one or more substituted or un-substituted nitrogen atoms. As used herein, the term "precursor" simply denotes that the compound can be reacted in a relatively simple one or two step chemical process to form metal oxide and/or metal nitride and/or metal oxynitride.

Suitable Metal Precursors Include All Possible Metals

More preferably, suitable metal amide precursors include titanium (Ti), zirconium (Zr), hafnium (Hf), tantalum (Ta), vanadium (V), niobium (Nb), tungsten (W) and molybdenum (Mo), and include compounds conforming to the following formula:

$$M(NR^1R^2)_n \qquad (1)$$

wherein M is a metal and $R^1$ and $R^2$ are alkyl groups such as substituted or un-substituted linear, branched, cyclic and aromatic alkyls. Preferably, M is a metal selected from the group consisting of titanium (Ti), zirconium (Zr), hafnium (Hf), tantalum (Ta), vanadium (V) and niobium (Nb). Preferably, n is an integer between 2 and 6, and more preferably n is either 4 or 5. Preferably, $R^1$ and $R^2$ are, individually, $C_1$-$C_6$ alkyls, cyclic alkyls, F-substituted alkyls, or H (hydrogen).

Suitable metal amide precursors also include metal amide/imides, i.e., compounds that contain a metal atom bonded through a single bond to a substituted or un-substituted nitrogen atom and bonded through a double bond to a substituted or un-substituted nitrogen atom. Suitable metal amide/imide precursors include, compounds conforming to the following formula:

$$(R^3{-}N{=})_m M'(NR^4R^5)_p \qquad (2)$$

wherein M' is a metal and $R^3$, $R^4$, and $R^5$ are, independently, selected from the group consisting of substituted or un-substituted linear, branched, cyclic and aromatic alkyls. Generally, M' is selected from the group of all possible metals, and more preferably M' is selected from the group of consisting of Ta, Nb, V, W, and Mo. Preferably, $R^3$, $R^4$, and $R^5$ are, individually, $C_1$-$C_6$ alkyls, cyclic alkyls, F-substituted alkyls, or H. In one preferred embodiment, m is 1 and p is 3 whenever M' is either Ta, Nb or V. In another embodiment, m is 2 and p is 2 whenever M' is either W or Mo.

When the metal amide-based precursor is exposed to a nitrogen source such as ammonia, a metal nitride layer is formed. Conversely, when the metal amide-based precursor is exposed to oxidant, a metal oxide layer is formed. Accordingly, by reacting the metal amide precursor with a nitrogen source, then with oxidant, alternating layers of metal nitride and metal oxide are formed in-situ. For example, a MN/$MO_z$/MN conformation can be formed wherein M is the same metal throughout structure. Because the same metal amide precursor or metal amide is used to generate each layer, the metal in each layer is the same, and the layers exhibit considerable compatibility.

Optionally, the compatibility, stability and electrical properties of the interface between the metal nitride and metal oxide layers can be further enhanced by creating intermediate metal oxynitride ($MO_xN_y$) layers. This is accomplished in-situ by exposing the metal amide precursor to a mixture of a nitrogen source, such as ammonia, and oxidant. For example, a MN/$MO_xN_y$/$MO_z$/$MO_xN_y$/MN conformation can be formed wherein M is the same metal throughout the structure.

Optionally, the metal oxynitride layers may be utilized in lieu of the metal oxide layers. Some metal oxynitrides are known to possess better dielectric properties than corresponding metal oxides. For example, a MN/MO$_x$N$_y$/MN conformation can be formed wherein M is the same metal throughout the capacitor structure.

In all cases, the result is a stacked MIM capacitor/structure wherein layers of metal oxide and/or layers of metal oxynitride are sandwiched between layers of metal nitride. As stated, due to the presence of same metal element throughout the structure, the layers are extremely compatible. Thus, no undesired reaction between adjacent layers or phase separation is induced.

Since the metal nitride layers are conductive electrodes and the metal oxide layers and/or metal oxynitride layers are highly dielectric (i.e., exhibiting a high dielectric constant k), a MIM capacitor is formed. The capacitor produced by the method of the present invention can be extremely thin, i.e., less than 50 angstroms in thickness, or much thinner, depending on the process and process parameters utilized.

FIG. 1 is a schematic of an exemplary embodiment of a first MIM capacitor 100 made in accordance with the present invention. In FIG. 1, the first MIM capacitor 100 comprises a central or middle dielectric layer 110 of a metal oxide, such as tantalum oxide (Ta$_2$O$_5$), and upper or lower layers or two outer layers 121, 122, of a metal nitride, such as tantalum nitride (TaN).

Figure 2:
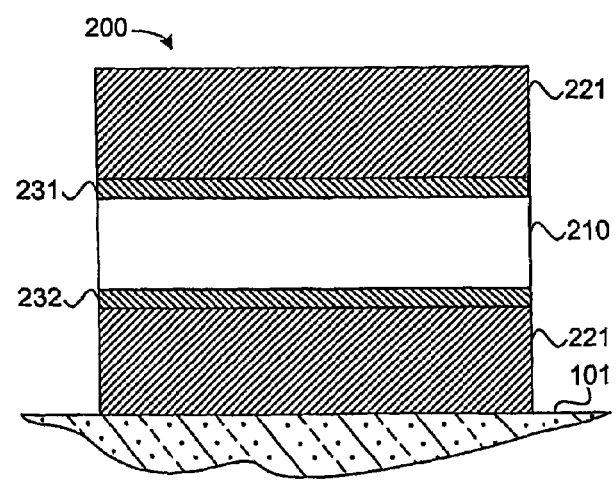
FIG. 2 is a schematic sectional side view of a second MIM capacitor made in accordance with another embodiment of the present invention.

FIG. 2 is a schematic of another exemplary embodiment of a second MIM capacitor 200 made in accordance with the present invention. In FIG. 2, the second MIM capacitor 200 comprises a middle layer 210 of a metal oxide, such as Ta2O5, two outer layers 221, 222, of a metal nitride, such as TaN, and two interstitial or intermediate layers 231, 232, of a metal oxynitride, such as titanium oxynitride (TaOxNy).

Figure 3:
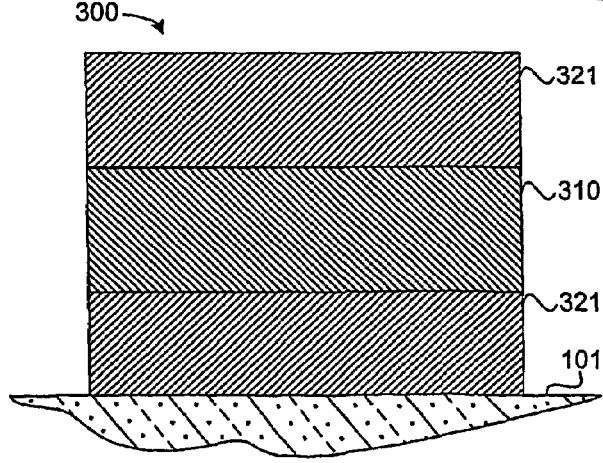
FIG. 3 is a schematic sectional side view of a third MIM capacitor made in accordance with yet another embodiment of the present invention.

FIG. 3 is a schematic of yet another exemplary embodiment of a third MIM capacitor 300 made in accordance with the present invention. In FIG. 3, the third MIM capacitor 300 comprises a middle layer 310 of a metal oxynitride, such as TaO$_x$N$_y$, and two outer layers 321, 322, of a metal nitride, such as TaN.

As noted above, the aforementioned capacitors are usually generated on a surface capable of binding the metal oxide layers. For example, the capacitors can be generated on a silicon surface of a substrate or wafer, and in particular of a semiconductor substrate or wafer.

Figure 4:
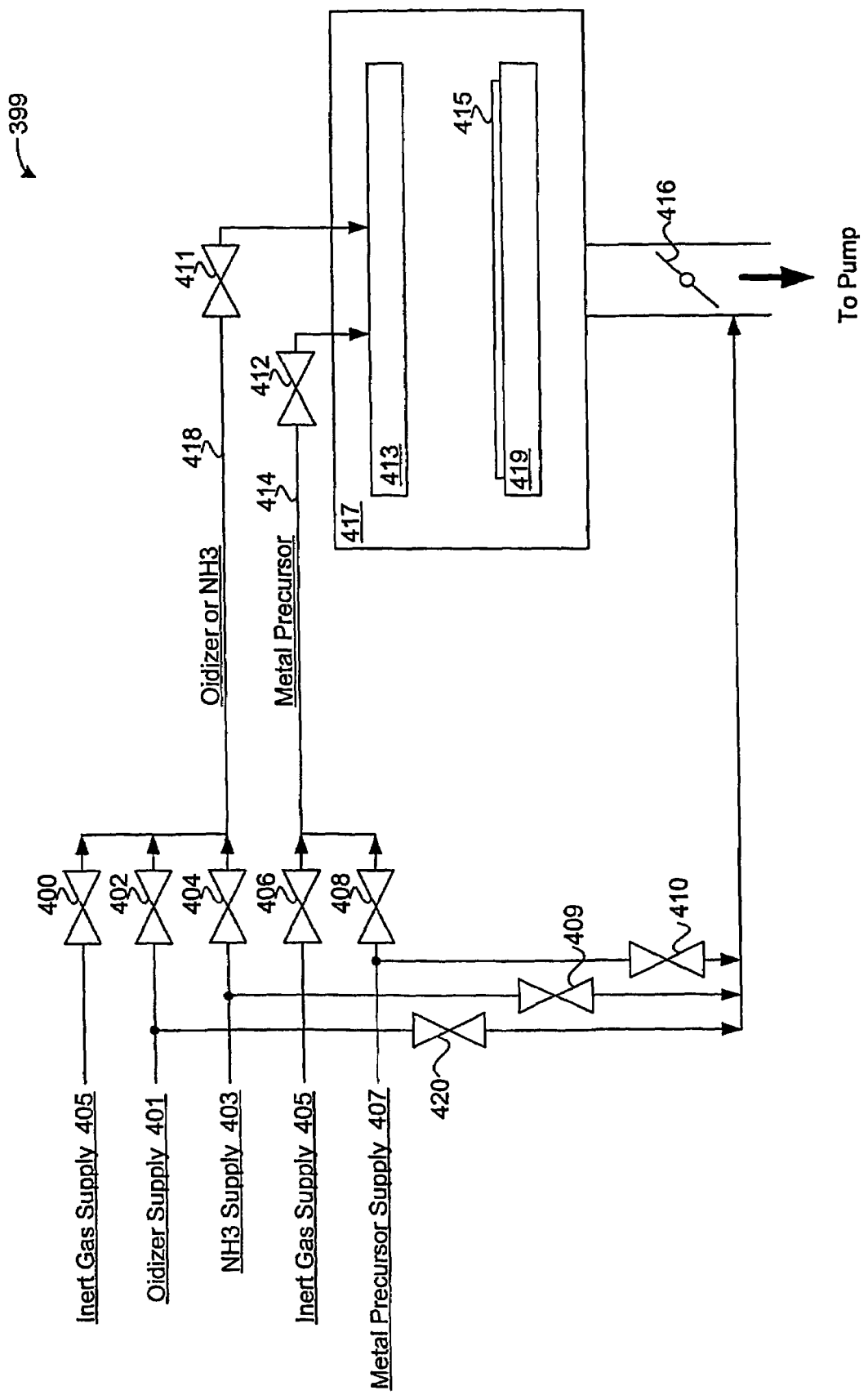
FIG. 4 is a schematic view of a of a process chamber suitable for in-situ formation of a MIM capacitor in accordance with an embodiment of the present invention.

An apparatus suitable for fabricating a MIM capacitor on a wafer according to an embodiment of the process of the present invention will now be described with reference to FIG. 4. FIG. 4, is a schematic block diagram of a process system or apparatus 399 suitable for in-situ formation of a MIM capacitor in accordance with an embodiment of the present invention.

Figure 5:
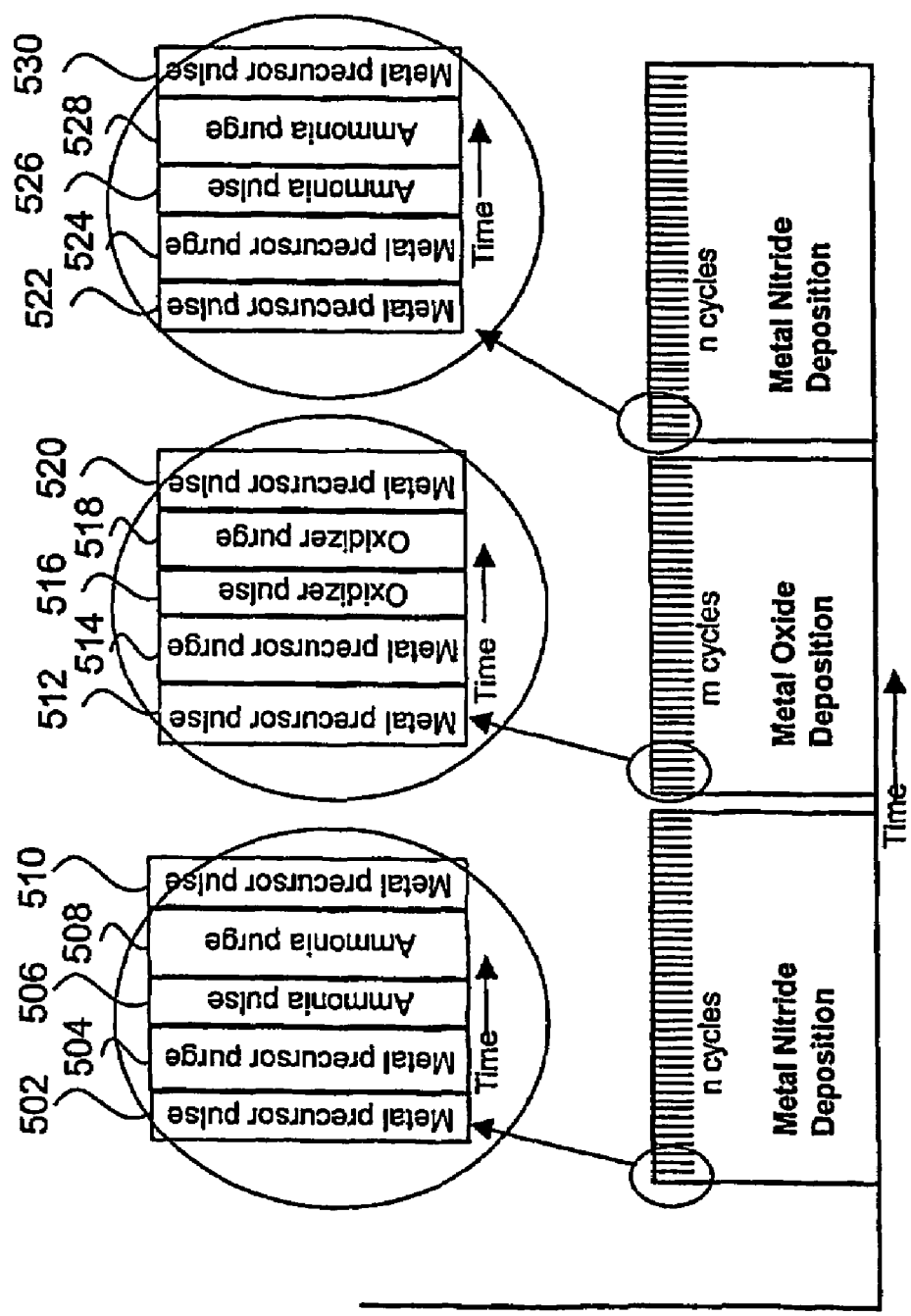
FIG. 5 is a process sequence showing a sequence of steps for depositing an MIM capacitor using an ALD process in accordance with an embodiment of the present invention.

In operation, a MIM capacitor is fabricated by introducing a wafer 415 into a reaction or process vacuum chamber 417 and heated the wafer to a predetermined process temperature (200 to 650 C) by a susceptor 419. The chamber 417 is filled to process pressure (0.1 to 5 Torr) using an inert gas (He, Ne, Ar, Xe, N2). In the case of ALD deposition, the gases are introduced as described in the next three paragraphs. The sequence of events for ALD deposition is shown schematically in FIG. 5.

The inert gas enters the chamber 417 through a showerhead 413 immediately above the wafer 415. The showerhead 413 is located from 1 mm to 50 mm above the wafer 415. The metal electrode layer MNy of the MIM is formed in the present invention by introducing a pulse of the metal precursor into the chamber 417 the metal precursor supply 407 through valves 408, 412, with or without inert gas supply through valve 406, and the metal precursor supply line 414 with precursor bypass valve 410 closed and inert gas flowing through the oxidizer/ammonia supply line 418 (Step 502). During the metal precursor pulse, no oxidizer or ammonia flows into the chamber. The metal precursor gas flow rate can be from 1 to 500 sccm. The duration of the flow pulse can be from 0.02 seconds to 20 seconds. Immediately after the pulse, the metal precursor is purged from the chamber 417 with an inert gas by closing valve 408 and briefly opening valve 406 (Step 504). The precursor purge time can be from 0.02 seconds to 20 seconds. Next, a pulse of ammonia flows into the chamber 417 via valves 404 and 411 (Step 506) with or without inert gas supply through valve 400. Bypass valve 409 is maintained closed. The ammonia flow can be from 50 sccm to 2000 sccm and the ammonia pulse time can be from 0.02 seconds to 20 seconds. During this ammonia pulse, the metal precursor supply line 414 is purged with inert gas. Immediately after the ammonia pulse, the ammonia is purged from the chamber 417 with an inert gas by closing valve 404 and briefly opening valve 400 (Step 508).

It may also be advantageous to have a pumping step (not shown) between the precursor pulse (Steps 502 and 504) and the ammonia pulse (Step 506) or between the ammonia pulse (Steps 506 and 508) and a subsequent precursor pulse (Step 510). If necessary, this step consists of shutting all gas supply valves to the chamber 417 and pumping the gases out of the chamber for some time. The pumping time can be from 0.02 seconds to 10 seconds. This sequence of pulses (Steps 502-510) are repeated for a number of cycles until a nitride film of sufficient thickness (typically more than 200 Å) is formed on the wafer 415, generally from about 20 to about 500 cycles or sequences of pulses.

Next a metal oxide dielectric layer MO$_x$ is formed on the metal nitride MN$_y$ electrode. A metal precursor pulse is introduced into the chamber 417 with or without inert gas supply through valve 406 and then purged from the chamber as described in the previous paragraph (Steps 512 and 514). Next a pulse of an oxidizer gas is introduced into the chamber 417 through the showerhead 413 by opening valve 402 (Step 516). The oxidizer flow can be from 100 to 2000 sccm, and if ozone is used the ozone concentration can be from 10 g/m$^3$ to 500 g/m$^3$. The oxidizer gas may be mixed with an inert gas flow through valve 400 from 10 sccm to 2000 sccm. The oxidizer pulse time can be from 0.02 seconds to 20 seconds in duration. During the oxidizer pulse, an inert gas flows through the metal precursor supply line 414 and into the chamber 417 to keep those lines purged. The inert gas flow is preferably about the same flow that was used during the metal pulse, and can be from 1 to 2000 sccm. After the oxidizer pulse is completed, valve 402 is closed and the oxidizer is shut off or is diverted to the exhaust via valve 420. The oxidizer supply line 418 is purged with an inert gas through valve 400 (Step 518). The purge time can be from 0.02 seconds to 20 seconds.

As noted above, it may also be advantageous to have a pumping step (not shown) between the precursor pulse and the oxidizer pulse or between the oxidizer steps (Steps 516 and 518) and the subsequent precursor pulse (Step 520). The pumping time can be from 0.02 seconds to 10 seconds. This sequence of metal precursor pulse/purge, oxidizer pulse/purge is repeated as many times, m cycles, as necessary to build up a metal oxide dielectric layer MO$_x$ layer of desired thickness (typically less than about 100 Å).

If an oxynitride dielectric material is desired to be formed, the process sequence described above can be altered to include ammonia pulse/purge steps (not shown) either before or after the oxidizer pulse/purge steps.

After completing the dielectric layer, a second metal nitride electrode is formed on top of the insulator material of the dielectric layer by repeating the sequence of steps described previously with respect to the first metal electrode layer MNy. Briefly, a pulse of the metal precursor is introduced into the chamber 417 with inert gas flowing through the oxidizer/ammonia supply line 418 (Step 522). Immediately after the pulse, the metal precursor is purged from the chamber 417 with an inert gas (Step 524). Next, a pulse of ammonia flows into the chamber 417 via valves 404 and 411 (Step 526). During this ammonia pulse, the metal precursor supply line 414 is purged with inert gas. Immediately after the ammonia pulse, the ammonia is purged from the chamber 417 with an inert gas (Step 528).

As noted above, there may also be a pumping step (not shown) between the precursor pulse (Steps 522 and 524) and the ammonia pulse (Step 526) or between the ammonia pulse (Steps 526 and 528) and a subsequent precursor pulse (Step 530).

Also, as with the formation of the first metal nitride electrode this sequence of pulses (Steps 522-530) is repeated for a number of cycles until a nitride film of sufficient thickness (typically more than 200 Å) is formed on the wafer 415, generally from about 20 to about 500 cycles or sequences of pulses.

For MOCVD deposition, the reactions to form the metal nitride electrode or the metal oxide insulator occur due to simultaneous mixing of the metal precursor and either ammonia (in the case of forming the metal nitride) or the oxidizer (in the case of forming the metal oxide). The reaction is initiated either thermally due to the susceptor 219 temperature or by a plasma created by applying a voltage to appropriate electrodes in or near the chamber 417.

Figure 6:
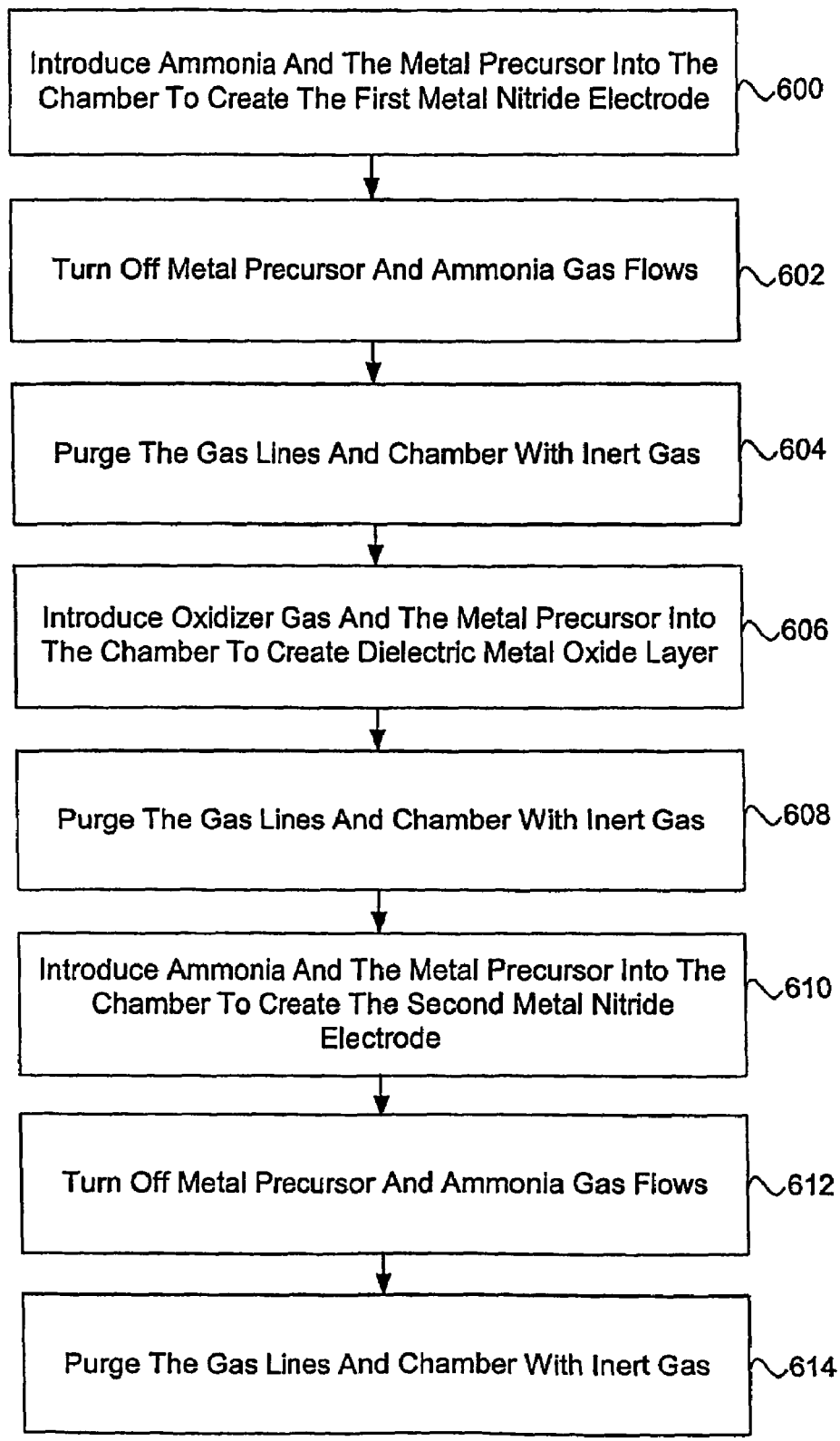
FIG. 6 is a flowchart showing a sequence of steps for depositing an MIM capacitor using an MOCVD process in accordance with another embodiment of the present invention.

The process sequence MOCVD deposition is shown in FIG. 6, and consists of the following steps. To create the metal nitride electrode, ammonia and the metal precursor are introduced into the chamber 417 via appropriate valves (Step 600). Gas flow rates can be from 10 to 300 sccm for the metal precursor vapor flow, 0 to 2000 sccm for an inert gas diluent, and 1 to 2000 sccm for the ammonia flow. The temperature can be from 300 C to 650 C and the process pressure can be from 0.1 Torr to 10 Torr. The process is run for a time sufficient to deposit the metal nitride film of required thickness (typically at least 200 Å). After deposition of the metal nitride layer, the metal precursor and ammonia gas flows are turned off by closing the appropriate valves (Step 602). The gas lines and chamber are purged with inert gas for an appropriate time with or without pumping the chamber to base pressure (Step 604).

Next the dielectric metal oxide is deposited. The metal precursor gas is introduced into the chamber along with the oxidizer gas flow by opening appropriate valves (Step 606). The metal precursor flow can be from 1 to 500 sccm and the oxidizer flow can be from 10 to 2000 sccm. The chamber pressure is adjusted to an appropriate pressure which can be from 1 to 10 Torr. The process is run for an appropriate time to deposit the required thickness (typically less than 100 Å). The gas lines and chamber are purged with inert gas for an appropriate time with or without pumping the chamber to base pressure (Step 608).

To create the second metal nitride electrode over the metal oxide dielectric layer, ammonia and the metal precursor are introduced into the chamber 417 via appropriate valves, step 610, and the process is run for a time sufficient to deposit the metal nitride film of required thickness (typically at least 200 Å). After deposition of the metal nitride layer, the metal precursor and ammonia gas flows are turned off by closing the appropriate valves (Step 612). The gas lines and chamber are purged with inert gas for an appropriate time with or without pumping the chamber to base pressure (Step 614).

In an alternative embodiment, not shown, where an oxynitride dielectric layer or intermediate layers are desired, to deposit the metal oxynitride by MOCVD the metal precursor, ammonia, and oxidizer are simultaneously mixed in the chamber 417. Gas flows, pressures, and temperatures are as described in the previous paragraph.

Some of the important aspects of the present invention will now be repeated to further emphasize the inventive MIM capacitor structure, methods of forming the same and advantages thereof.

In one aspect, the invention is directed to a method for the in-situ fabrication of a metal insulator metal (MIM) capacitor on a substrate. Generally, the method involves: (i) reacting a metal precursor at least once with a nitrogen source to form a first metal nitride electrode on the substrate; (ii) reacting the metal precursor at least once with an oxidant to form a dielectric layer on the first metal nitride electrode; and (iii) reacting the metal precursor at least once with the nitrogen source to form a second metal nitride electrode on the substrate. The metal precursor can be either a metal amide or metal imide selected from the group consisting of Zr, Ti, Hf, Ta, V, Nb, W and Mo. 8. The nitrogen source can be ammonia, atomic nitrogen, hydrazine, or primary, secondary, or tertiary alkyl amines. Suitable oxidants include oxygen, ozone, atomic oxygen, nitrous oxide, or hydrogen peroxide In accordance, with the present invention the process can be performed as either an ALD or MOCVD process. Preferably, in an ALD process, the steps of forming the first and second metal nitride electrodes involves introducing the metal precursor and the nitrogen source in from about 20 to about 500 sequentially pulses until a nitride film of sufficient thickness is formed on the substrate. Similarly, the step of forming the dielectric layer involves introducing the metal precursor and the oxidant in from about 20 to about 500 sequentially pulses until a dielectric layer of sufficient thickness is formed on the substrate.

In one embodiment, the step of forming the dielectric layer on the first metal nitride electrode further comprises the step of reacting the metal precursor at least once with the nitrogen source to form a metal oxynitride dielectric layer on the first metal nitride electrode.

In another embodiment, the method further includes the steps of: (i) after forming the first metal nitride electrode, reacting the metal precursor at least once with the oxidant and the nitrogen source to form a first metal oxynitride interposer layer on the first metal nitride electrode; and (ii) after forming the dielectric layer, reacting the metal precursor at least once with the oxidant and the nitrogen source to form a second metal oxynitride interposer layer on the dielectric layer.

In yet another embodiment, the metal precursor is a metal amide of the form:

where M is the metal element, N is nitrogen, and $R^1$ and $R^2$ are, independently, selected from the following groups: hydrogen, substituted or un-substituted linear, branched, cyclic, and aromatic alkyls and n is 4 or 5.

In still another embodiment, the metal amide precursor is of the form:

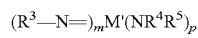

where M is the metal element, and $R^3$, $R^4$, and $R^5$ are, independently, selected from the following groups: hydrogen, substituted or un-substituted linear, branched, cyclic and aromatic alkyls. In one version of this embodiment, the metal element M is Zr, Ti, Hf, Ta, V, Nb, W or Mo, and m is 1 and p is 3 when M is either Ta or Nb. Alternatively, when M is either W or Mo m is 2 and p is 2.

Having described preferred embodiments and examples of a novel MIM capacitors and methods of forming the same (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims

What is claimed is:

1. A process for the in-situ fabrication of a metal insulator metal (MIM) capacitor on a substrate, the method comprising sequential steps of:
   reacting a metal precursor at least once with a nitrogen source to form a first metal nitride electrode on the substrate;
   reacting the metal precursor at least once with an oxidant to form a dielectric layer on the first metal nitride electrode; and
   reacting the metal precursor at least once with the nitrogen source to form a second metal nitride electrode on the substrate.

2. A. process according to claim 1, wherein the step of forming the dielectric layer on the first metal nitride electrode further comprises the step of reacting the metal precursor at least once with the nitrogen source to form a metal oxynitride dielectric layer on the first metal nitride electrode.

3. A. process according to claim 1, further comprising the steps of:
   after forming the first metal nitride electrode, reacting the metal precursor at least once with the oxidant and the nitrogen source to form a first metal oxynitride interposer layer on the first metal nitride electrode; and
   after forming the dielectric layer, reacting the metal precursor at least once with the oxidant and the nitrogen source to form a second metal oxynitride interposer layer on the dielectric layer.

4. A substrate produced by processing according to the method of claim 1, 2 or 3.

5. A process according to claim 1, wherein the process is an ALD or MOCVD process.

6. A process according to claim 5, wherein the metal precursor is a metal amide or metal imide selected from the group consisting of Zr, Ti, Hf, Ta, V, and Nb.

7. A process according to claim 5, wherein the metal precursor is a metal amide or metal imide selected from the group consisting of W and Mo.

8. A process according to claim 5, wherein the nitrogen source is selected from the group consisting of ammonia, atomic nitrogen, hydrazine, or primary, secondary, and tertiary alkyl amines.

9. A process according to claim 5, wherein the oxidant is selected from the group consisting of oxygen, ozone, atomic oxygen, nitrous oxide, or hydrogen peroxide.

10. A process according to claim 5, wherein the metal precursor is a metal amide of the form:

$$M(NR^1R^2)_n$$

where M is the metal element, N is nitrogen, and $R^1$ and $R^2$ are, independently, selected from the following groups: hydrogen, substituted or un-substituted linear, branched, cyclic, and aromatic alkyls and n is 4 or 5.

11. A process according to claim 10, wherein the metal element M is selected from the group consisting of Zr, Ti, Hf, Ta, V, Nb, W and Mo.

12. A process according to claim 5, wherein the metal amide precursor is of the form:

$$(R^3\text{---}N\text{==})_m M'(NR^4R^5)_p$$

where M is the metal element, and $R^3$, $R^4$, and $R^5$ are, independently, selected from the following groups: hydrogen, substituted or un-substituted linear, branched, cyclic and aromatic alkyls.

13. A process according to claim 12, wherein the metal element M is selected from the group consisting of Zr, Ti, Hf, Ta, V, Nb, W and Mo.

14. A process according to claim 13, wherein m is 1 and p is 3 when M is either Ta or Nb.

15. A process according to claim 13, wherein m is 2 and p is 2 when M is either W or Mo.

16. A substrate produced by processing according to the method of claims 6, 7, 8, 9, 10, 11 or 12.

* * * * *